(12) United States Patent
Sheng-Hsiung

(10) Patent No.: US 7,342,790 B2
(45) Date of Patent: Mar. 11, 2008

(54) HEAT SINK FASTENING DEVICE

(75) Inventor: Cheng Sheng-Hsiung, Taipei Hsien (TW)

(73) Assignee: Aopen Inc., Hsi-Chih, Taipei Hsien (TW)

( * ) Notice: Subject to any disclaimer, the term of this patent is extended or adjusted under 35 U.S.C. 154(b) by 1341 days.

(21) Appl. No.: 10/202,004

(22) Filed: Jul. 25, 2002

(65) Prior Publication Data

US 2005/0072555 A1    Apr. 7, 2005

(30) Foreign Application Priority Data

Aug. 1, 2001    (TW) .............................. 90213012 U

(51) Int. Cl.
*H05K 7/20*    (2006.01)

(52) U.S. Cl. .................... 361/704; 24/457; 24/458; 248/505; 248/510; 257/719; 361/707; 361/710; 361/719; 439/485; 439/487

(58) Field of Classification Search ................. 24/457, 24/458; 248/505, 510; 257/718–719; 361/704, 361/707, 710; 439/485, 510, 487
See application file for complete search history.

(56) References Cited

U.S. PATENT DOCUMENTS

| | | | | |
|---|---|---|---|---|
| 5,396,402 A | * | 3/1995 | Perugini et al. ............ | 361/704 |
| 5,486,981 A | * | 1/1996 | Blomquist ................... | 361/704 |
| 5,933,325 A | * | 8/1999 | Hou ............................ | 361/704 |
| 6,108,207 A | * | 8/2000 | Lee ............................. | 361/704 |
| 6,370,024 B1 | * | 4/2002 | Lo .............................. | 361/704 |
| 6,430,049 B1 | * | 8/2002 | Lai et al. .................... | 361/704 |

* cited by examiner

*Primary Examiner*—Gregory D Thompson
(74) *Attorney, Agent, or Firm*—Winston Hsu

(57) ABSTRACT

A central processing unit (CPU) assembly is disclosed having: a CPU; a socket removably receiving the CPU; a heat sink removably attaching atop the CPU; and a fastening device removably fastening the heat sink, the CPU, and the socket together. The fastening device is characterized by consisting: an elongated resilient body upon which a contacting surface is disposed for contacting the heat sink and pressing the heat sink against the CPU; two lever bars extending from opposite ends of the resilient body for exerting forces on the fastening device so as to fasten or remove the fastening device; and two latching arms extending from the ends of the resilient body for engaging the fastening device with the socket in an engage position, the latching arms in the engage position exerting an inward resilient force upon the socket at opposite sides thereof.

16 Claims, 6 Drawing Sheets

HEAT SINK FASTENING DEVICE

RELATED APPLICATION

The present invention claims to benefit from the priority of Taiwan application No. 090213012, filed at Aug. 1, 2001.

BACKGROUND OF THE INVENTION

1. Field of the Invention

The present invention is directed to a heat sink fastening device for attaching a heat sink to an integrated circuit and a socket receiving the integrated circuit.

2. Description of the Prior Art

The overheating of integrated circuits and central processing units (CPU), in particular, has been the critical issue that needs to be seriously addressed for a computer system to function normally without system failure. This is especially true in the present day when the clock speed of a typical CPU is so fast and the requisite computations are so great that an increased amount of heat is generated from it. In order to carry the waste heat away from the CPU and therefore lower its operating temperature, a heat sink device is conventionally utilized to effect the dissipation of heat.

FIG. 1 illustrates how a heat sink is clamped onto a CPU according to the prior art. A CPU 103 is to be inserted into a socket 104 specially designed for this purpose on a motherboard, for example. A heat sink 102 with arrays of fin structure is attached to the upper surface of the CPU 103. The contact between the heat sink 102 and the CPU 103 is supposed to be tight and the contact surface as large as possible, so that the heat transfer between them can be optimized. For such purpose, a clip 100 is used to tightly and securely fasten the heat sink 102 upon the CPU 103. The clip 100 has an elongated elastic main body that enters into the spacing 105 of the heat sink 102 and contacts the base surface of the heat sink 102 at a pressing portion 107 on the main body. At the opposite ends of the main body are two latching portions 101 each having an opening for engaging with two protrusions 106 disposed on opposite sides of the socket 104, and thereby tightly clamping the heat sink 102, the CPU 103, and the socket 104 altogether.

Usually the clip 100 includes a lever arm 108 to facilitate mounting and removing of the clip 100. The clamping force is derived from the M shape of the clip 100, as is illustrated in FIG. 2, which deforms elastically when the latching portions 101 are locked onto the protrusions 106 and the pressing portion 107 is contacting and pressing the heat sink 102 against the CPU 103. Although the clip 100 is capable of exerting a downward force upon the heat sink 102 when mounted thereon due to elastic deformation, it simultaneously exerts an outward force upon the protrusions 106. This is because that, when mounting the clip 100, the latching portions 101 have to be pushed inwardly towards each other in order to lock onto the protrusions 106, so that the resilient force of the latching portions 101 in the locked position is directed outward. This is disadvantageous, for the outward resilient force tends to disengage the latching portions 101 out of the protrusions 106, especially during sudden vibration and percussions of the whole assembly.

SUMMARY OF THE INVENTION

The present invention addresses the problem of the prior art by providing a heat sink clip structure that prevents itself from disengaging with the CPU unit on which it is applied. The inventive clip includes latching arms for locking with a CPU socket and for maintaining an inward instead of outward force that more tightly engages the clip with the CPU socket. The latching arms are sized and shaped that they resiliently expand when engaging with the CPU socket so as to produce the inward force preventing its disengagement with the socket. Supporting arms and a clamp are further provided on the clip structure to assist the clip to more securely and more firmly unite itself with the heat sink on which it is applied.

BRIEF DESCRIPTION OF THE DRAWING

These and other objects of the present invention will be described with respect to the following drawings in which.

DETAILED DESCRIPTION OF THE PREFERRED EMBODIMENTS

Figure 1:
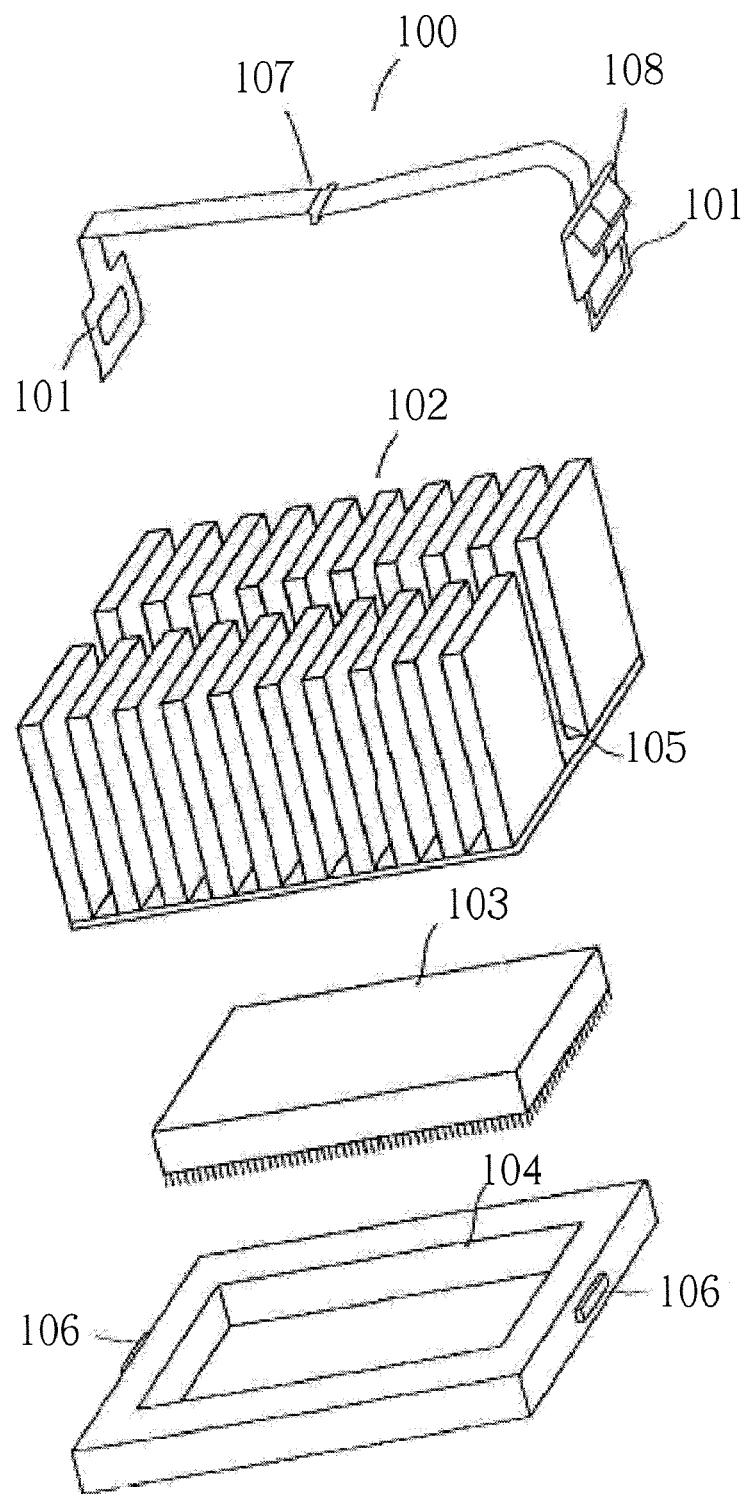
FIG. 1 is an exploded view of a prior art assembly using a clip to attach the heat sink onto a CPU.
Figure 2:
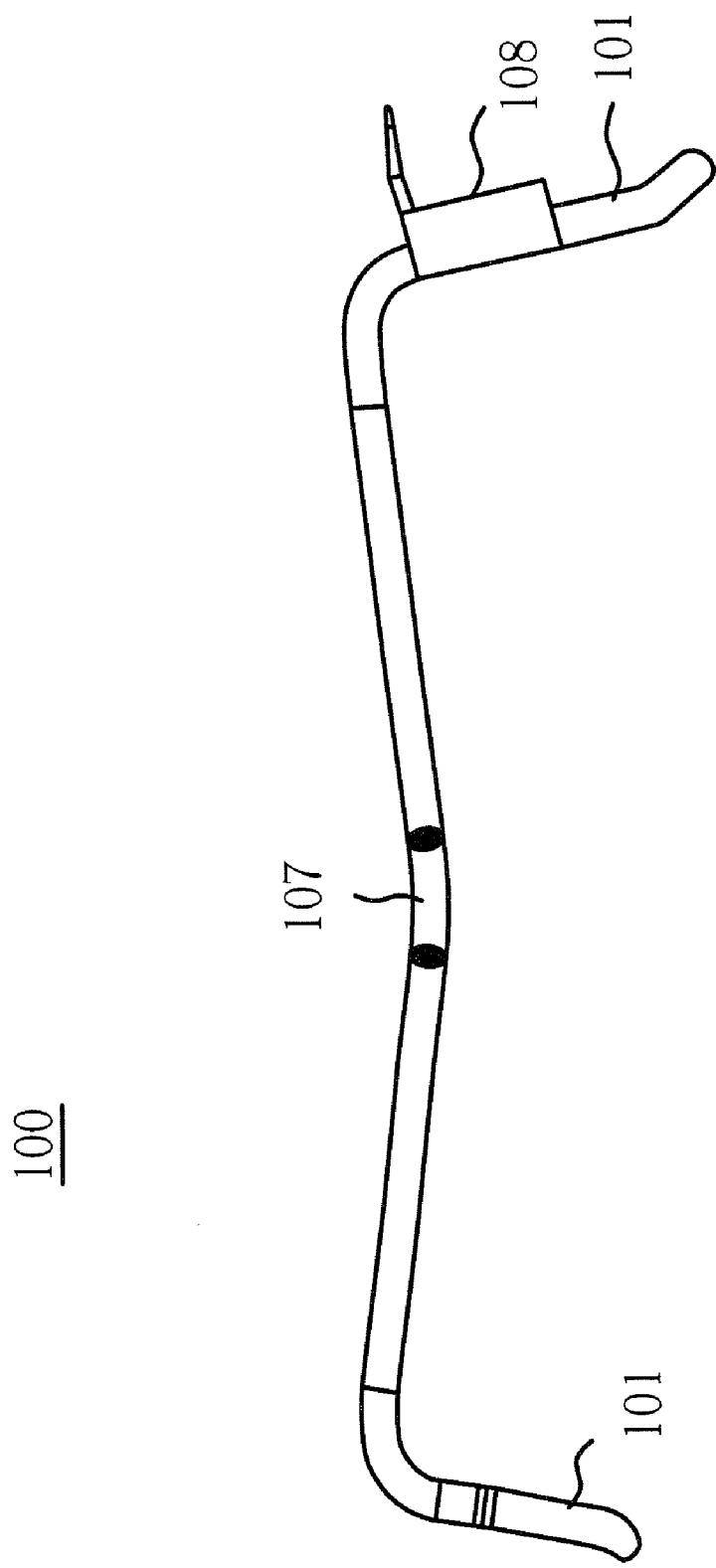
FIG. 2 is a side view of the prior art clip of FIG. 1.
Figure 3:
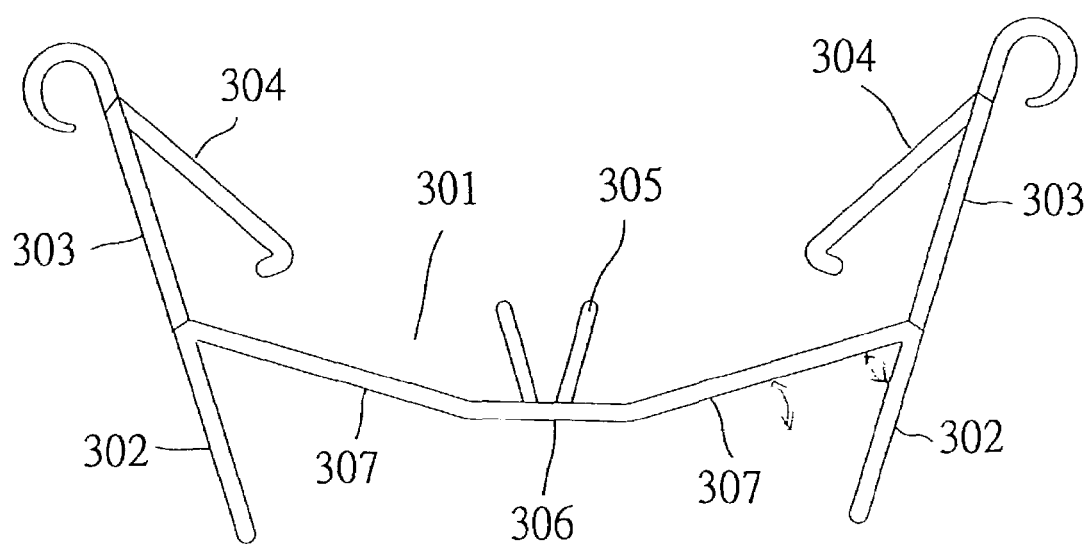
FIG. 3 is a side view of one embodiment of the heat sink clip according to the present invention.
Figure 4:
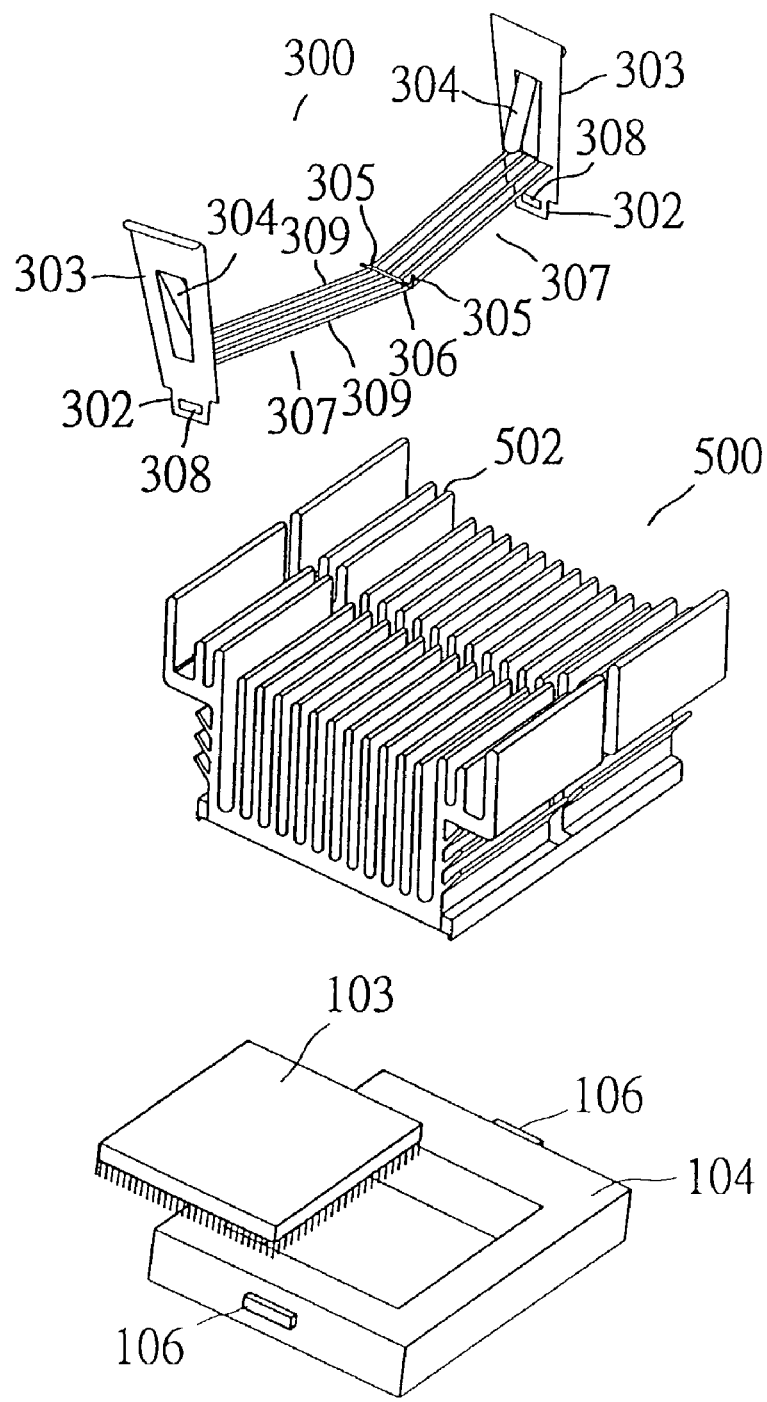
FIG. 4 an exploded view of an assembly using the inventive clip of FIG. 3 to attach the heat sink onto a CPU.

FIG. 3 is a side view of one embodiment of the heat sink clip according to the present invention, and FIG. 4 an exploded view of an assembly using the inventive clip of FIG. 3 to attach the heat sink onto a CPU. The clip 300 includes an resilient body 301 for creating the clamping force, two latching arms 302 disposed at opposite ends of the resilient body 301 having openings 308 for locking with the protrusions 106 of the socket 104, and lever bars 303 extending upwards from the latching arms 302 for exerting forces deforming the resilient body 301 and mounting the clip 300 onto a locked position. The end portion of the lever bars 303 are curved so that the user can more easily and single-handedly handle and exert forces on the clip 300 through his finger tips.

Elongated slots are formed on the resilient body 301, which divides the resilient body 301 into resilient strips 309 with a width less than the spacing or gap of the fin arrays of the heat sink 500. Therefore the resilient body 301 can enter into the fin arrays and contact the base of the heat sink 500 for exerting clamping force upon it. The resilient body 301 further includes a contacting surface 306 for making contact with the base of the heat sink 500, and spring portions 307 both inflected upward with respect to the contacting surface 306. The inflection angles of the resilient body 301 enable the contacting surface 306 to press the heat sink 500 firmly against the CPU 103. In the present embodiment, they are both 16 degrees, and in another 20 degrees.

The latching arms 302 make an angle of 64 degrees with respect to the spring portions 307 in the present embodiment, though other values are possible. This makes the latching arms 302 inflect inwardly towards each other in their initial configuration. When the clip 300 is used to fasten the heat sink 500 onto the CPU 103 and the socket 104, the user depresses the lever bars 303 downwardly and inwardly, in such a manner that the downward force presses the heat sink 500 against the CPU 103 via the contacting surface 106, and the inward force displaces the latching arms 302 away from each other by certain distance that allows the latching arms 302 to engage with the protrusions 106 of the socket 104. Because the latching arms 302 are pulled away from each other when they lock with the protrusions 106, the resilient force produced in the resilient body 301 tends to push the latching arms 302 inwardly, thus holding the latching arms 302 more tightly in their locked position. By making the initial span of the latching arms 302 less than that of the protrusions 106, the inward resilient force is generated as the clip 300 holds the CPU assembly together, which prevents the assembly from disintegration during vibrations.

Figure 5:
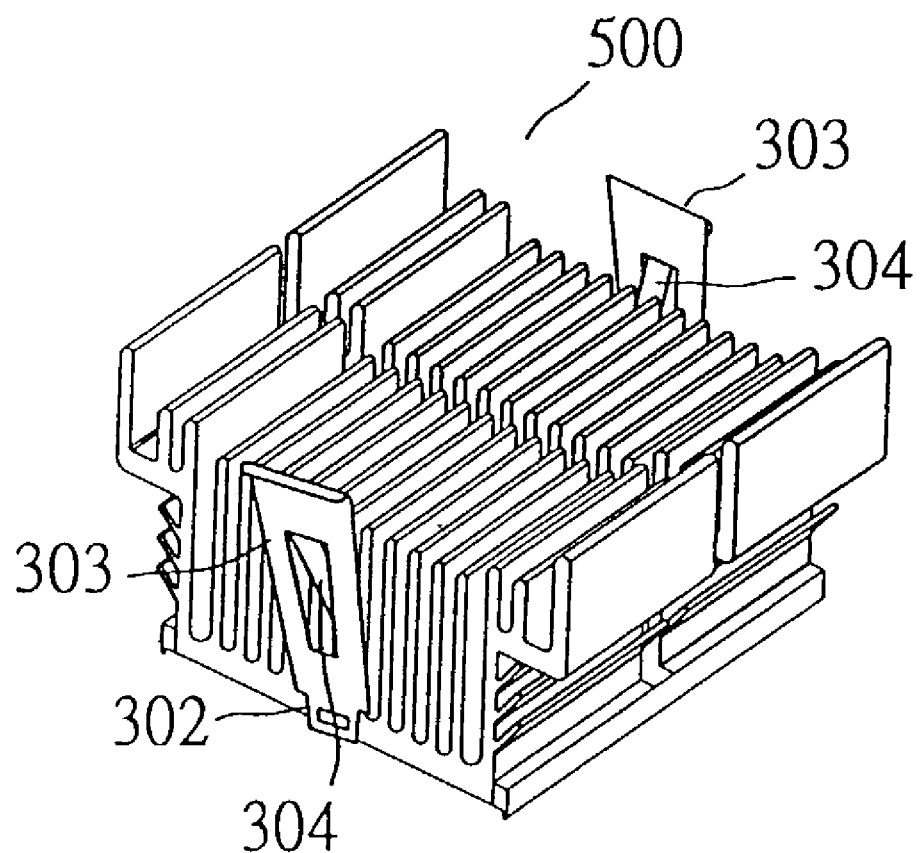
FIG. 5 is an illustration showing how the inventive clip cooperates with the heat sink.

In addition to creating an inward force on the part of the latching arms 302 when applied to the CPU assembly, the clip 300 further includes supporting arms 304 which are inward extensions of the lever bars 303 and resiliently contact the edges of the fin arrays of the heat sink 500, as illustrated in FIG. 5 showing how the inventive clip cooperates with the heat sink. The supporting arms 304 create an outward resilient force acting upon the lever bars 303, resulting the clip 300 being more tightly fastened onto the heat sink 500 and the latching arms 302 being further pressed inwardly on the sides the socket 104, which further reduces the possibility of undue disengagement of the clip 300 with the CPU assembly. In the present embodiment, the supporting arms 304 make an angle of 31 degrees with the lever bars 303.

Figure 6:
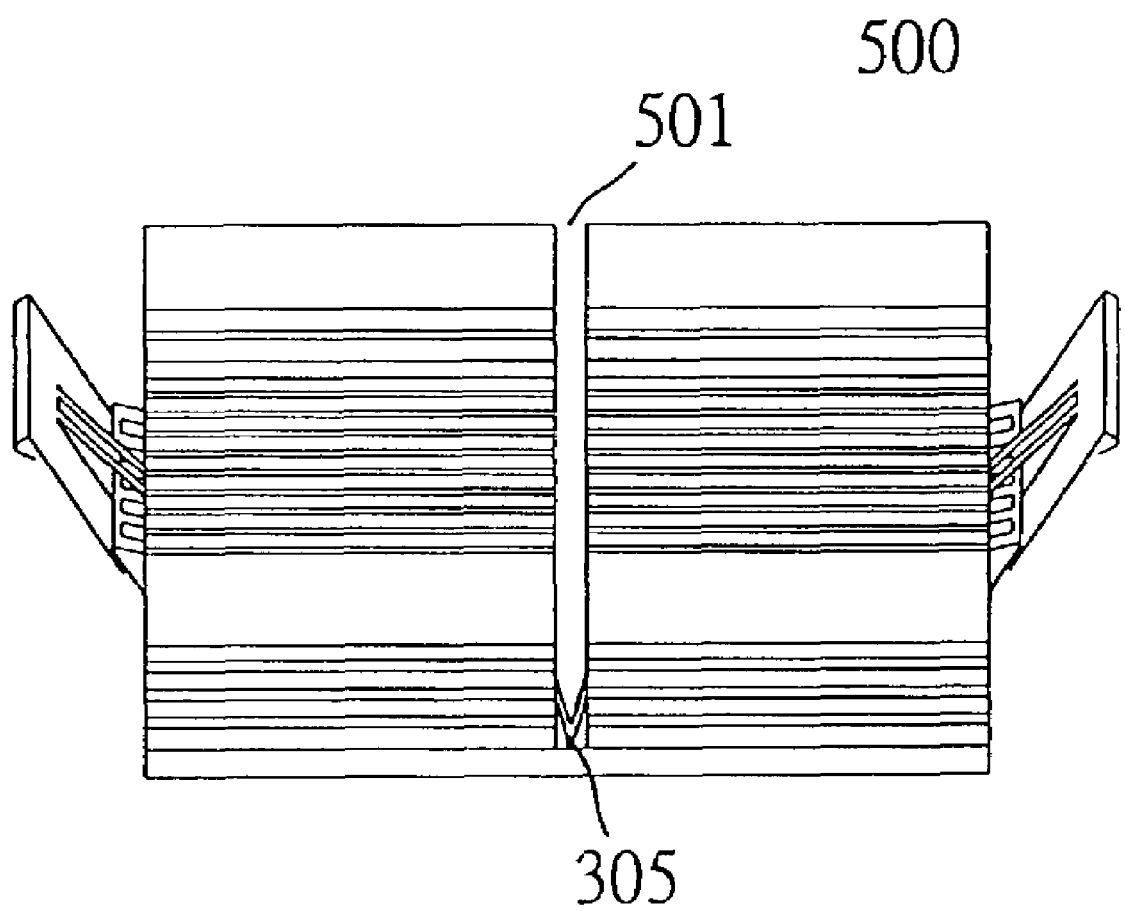
FIG. 6 is another illustration showing how the inventive clip cooperates with the heat sink.

Furthermore, a V-shaped clamp 305 positioned on the portion of the contacting surface 306 of the resilient body 301 provides another retaining force for the clip 300 and the heat sink 500. As illustrated in FIG. 6, the clamp 305 presses itself on the inner edges of the fin arrays between spacing of the heat sink 500 so that displacement or disengagement between the clip 300 and the heat sink 500 is further avoided.

It is to be understood that the forms of the invention as shown and described herein are but preferred embodiments thereof and that various changes and modifications can be made therein without departing from the spirit or scope of the invention. For example, the angles between constituents of the clip structure determines the fastening strength and the resilient force produced when deformed, and therefore can vary based on the size and shape of the heat sink and CPU unit to which the clip is to be applied. The actual size and shape of the latching arms, the lever bars, the resilient body, the clamp, and the supporting arms may be altered to produce the same effects of the embodiment described hereinabove. The material used to make the clip is not limited, as long as the property of the material is resilient or elastic so as to produce resilient forces requisite for fastening purposes. These and other modifications should be obvious for one skilled in the art. The true scope of the invention is defined in the following claims.

What is claimed is:

1. A heat sink fastening device for fastening a heat sink onto a central processing unit (CPU), comprising:
   an elongated resilient body upon which a contacting surface is disposed for contacting the heat sink and pressing the heat sink against a top surface of the CPU;
   two lever bars extending from opposite ends of the resilient body for exerting forces on the fastening device by the user;
   two latching arms extending from the ends of the resilient body, each having an opening for engaging with protrusions at opposite ends of a socket receiving the CPU in an engage position, the latching arms in the engage position exerting an inward resilient force upon the socket at opposite sides thereof; and a V-shaped clamp disposed at the central portion of the resilient body for resiliently fitting into fin spacing of the heat sink in the engage position.

2. The fastening device of claim 1, further comprising two supporting arms disposed on the lever bars for resiliently pressing on opposite sides of the heat sink in the engage position.

3. The fastening device of claim 2, wherein the supporting arms make an angle of 31 degrees with the corresponding lever bars in an initial configuration of the fastening device.

4. The fastening device of claim 1, wherein the resilient body comprises a flat central portion forming the contacting surface and two upwardly inflecting portions extending from the central portion.

5. The fastening device of claim 4, wherein the inflection angle of the inflecting portions is 16 degrees in an initial configuration of the fastening device.

6. The fastening device of claim 4, wherein the inflection angle of the inflecting portions is 20 degrees in an initial configuration of the fastening device.

7. The fastening device of claim 4, wherein the latching arms make an angle of 64 degrees with the corresponding inflecting portions in an initial configuration of the fastening device.

8. The fastening device of claim 1, wherein at least one slot is made on the resilient body along the elongated direction thereof, which allows fins of the heat sink to pass through in the engage position.

9. A central processing unit (CPU) assembly, comprising:
   a CPU;
   a socket removably receiving the CPU;
   a heat sink removably attaching atop the CPU; and
   a fastening device removably fastening the heat sink, the CPU, and the socket together, the fastening device comprising:
      an elongated resilient body upon which a contacting surface is disposed for contacting the heat sink and pressing the heat sink against the CPU;
      two lever bars extending from opposite ends of the resilient body for exerting forces on the fastening device so as to fasten or remove the fastening device;
      two latching arms extending from the ends of the resilient body, each having an opening for engaging with protrusions at opposite ends of the socket in an engage position, the latching arms in the engage position exerting an inward resilient force upon the socket at opposite sides thereof; and a V-shaped clamp disposed at the central portion of the resilient body for resiliently fitting into fin spacing of the heat sink in the engage position.

10. The CPU assembly of claim 9, further comprising two supporting arms disposed on the lever bars for resiliently pressing on opposite sides of the heat sink in the engage position.

11. The CPU assembly of claim 9, wherein the resilient body comprises a flat central portion forming the contacting surface and two upwardly inflecting portions extending from the central portion.

12. The fastening device of claim 9, wherein at least one slot is made on the resilient body along the elongated direction thereof, which allows fins of the heat sink to pass through in the engage position.

13. A heat sink fastening device for fastening a heat sink onto a central processing unit (CPU), comprising:
   an elongated resilient body having a flat central portion forming a contacting surface for contacting the heat sink and pressing the heat sink against a top surface of the CPU, and two upwardly inflecting portions extending from the central portion;

two lever bars extending from the upwardly inflecting portions at opposite ends of the resilient body for exerting forces on the fastening device by the user; and two latching arms extending from the ends of the resilient body, each having an opening for engaging with protrusions at opposite sides of a socket receiving the CPU in an engage position, the latching arms in the engage position being resiliently displaced away from each other compared to an initial configuration thereof.

14. The fastening device of claim 13, further comprising a V-shaped clamp disposed at the central portion of the resilient body for resiliently fitting into fin spacing of the heat sink in the engage position.

15. The fastening device of claim 13, further comprising two supporting arms disposed on the lever bars for resiliently pressing on opposite sides of the heat sink in the engage position.

16. The fastening device of claim 13, wherein at least one slot is made on the resilient body along the elongated direction thereof, which allows fins of the heat sink to pass through in the engage position.

* * * * *